United States Patent
Chen et al.

(10) Patent No.: US 9,502,117 B2
(45) Date of Patent: *Nov. 22, 2016

(54) CELL-LEVEL STATISTICS COLLECTION FOR DETECTION AND DECODING IN FLASH MEMORIES

(71) Applicant: Seagate Technology LLC, Cupertino, CA (US)

(72) Inventors: Zhengang Chen, San Jose, CA (US); Erich F. Haratsch, Bethlehem, PA (US)

(73) Assignee: Seagate Technology LLC, Cupertino, CA (US)

( * ) Notice: Subject to any disclaimer, the term of this patent is extended or adjusted under 35 U.S.C. 154(b) by 295 days.

This patent is subject to a terminal disclaimer.

(21) Appl. No.: 13/778,728

(22) Filed: Feb. 27, 2013

(65) Prior Publication Data

US 2013/0176778 A1   Jul. 11, 2013

Related U.S. Application Data

(63) Continuation-in-part of application No. 13/063,888, filed on Aug. 31, 2011, now Pat. No. 8,830,748, and a continuation-in-part of application No. 13/063,895, filed on May 31, 2011, now Pat. No. 9,378,835, and a (Continued)

(51) Int. Cl.
*G11C 16/06* (2006.01)
*G11C 16/34* (2006.01)
(Continued)

(52) U.S. Cl.
CPC ........... *G11C 16/06* (2013.01); *G06F 11/1072* (2013.01); *G06F 12/0246* (2013.01); *G11C 11/5642* (2013.01); *G11C 16/34* (2013.01); *G11C 16/26* (2013.01); *G11C 16/3431* (2013.01)

(58) Field of Classification Search
None
See application file for complete search history.

(56) References Cited

U.S. PATENT DOCUMENTS

| 4,015,238 A | 3/1977 | Davis |
| 5,867,429 A | 2/1999 | Chen et al. |

(Continued)

FOREIGN PATENT DOCUMENTS

| IL | WO 2007132457 A2 * | 11/2007 | .......... G06F 11/1072 |
| IL | WO 2008053472 A2 * | 5/2008 | .......... G06F 11/1068 |

(Continued)

OTHER PUBLICATIONS

Engh L.D.; Kordesch, A.V.; Chun-Mai Liu, "A Self Adaptive Programming Method with 5 mV Accuracy for Multi-Level Storage in FLASH," Proceedings of the IEEE 2002 Custom Integrated Circuits Conference, 2002, pp. 115-118.*

(Continued)

*Primary Examiner* — Mark Giardino, Jr.
*Assistant Examiner* — Glenn Gossage
(74) *Attorney, Agent, or Firm* — Ryan, Mason & Lewis, LLP

(57) ABSTRACT

Methods and apparatus are provided for collecting cell-level statistics for detection and decoding in flash memories. Data from a flash memory device is processed by obtaining one or more read values for a plurality of bits in a page of the flash memory device; and generating cell-level statistics for the flash memory device based on a probability that a data pattern was read from the plurality of bits given that a particular pattern was written to the plurality of bits. The cell-level statistics are optionally generated substantially simultaneously with a reading of the read values, for example, as part of a read scrub process. The cell-level statistics can be used to convert the read values for the plurality of bits to a reliability value for a bit among the plurality of bits.

20 Claims, 10 Drawing Sheets

Related U.S. Application Data continuation-in-part of application No. 13/063,899, filed on May 31, 2011, now Pat. No. 8,892,966, and a continuation-in-part of application No. 13/063,874, filed on Mar. 14, 2011, now Pat. No. 9,064,594, and a continuation-in-part of application No. 13/731,766, filed on Dec. 31, 2012, now Pat. No. 9,292,377.

(51) Int. Cl.
*G11C 11/56* (2006.01)
*G06F 12/16* (2006.01)
*G06F 11/10* (2006.01)
*G06F 12/02* (2006.01)
*G11C 16/26* (2006.01)

(56) References Cited

U.S. PATENT DOCUMENTS

| | | | |
|---|---|---|---|
| 6,029,264 | A | 2/2000 | Kobayashi et al. |
| 6,134,141 | A | 10/2000 | Wong |
| 6,625,236 | B1 | 9/2003 | Dent et al. |
| 6,625,778 | B1 | 9/2003 | Nakamura et al. |
| 6,813,322 | B2 | 11/2004 | Fulghum et al. |
| 6,980,140 | B1 | 12/2005 | Rowland et al. |
| 7,107,511 | B2 | 9/2006 | Shen et al. |
| 7,299,026 | B2 | 11/2007 | Hayashi |
| 7,388,781 | B2 | 6/2008 | Litsyn et al. |
| 7,508,704 | B2 * | 3/2009 | Honma et al. ........... 365/185.03 |
| 7,526,715 | B2 | 4/2009 | Litsyn et al. |
| 7,558,109 | B2 | 7/2009 | Brandman et al. |
| 7,643,342 | B2 | 1/2010 | Litsyn et al. |
| 7,656,707 | B2 | 2/2010 | Kozlov |
| 7,730,384 | B2 | 6/2010 | Graef et al. |
| 7,877,564 | B2 | 1/2011 | Eldredge |
| 7,975,192 | B2 | 7/2011 | Sommer et al. |
| 8,032,810 | B2 | 10/2011 | Ishikawa et al. |
| 8,145,984 | B2 | 3/2012 | Sommer et al. |
| 8,301,986 | B2 | 10/2012 | Jo et al. |
| 8,458,563 | B2 | 6/2013 | Sharon et al. |
| 8,464,131 | B2 | 6/2013 | Sharon et al. |
| 8,830,748 | B2 | 9/2014 | Haratsch et al. |
| 2003/0101411 | A1 | 5/2003 | Denno |
| 2004/0032347 | A1 | 2/2004 | Yamazaki |
| 2006/0015802 | A1 | 1/2006 | Hocevar |
| 2006/0195772 | A1 | 8/2006 | Graef et al. |
| 2006/0221714 | A1 | 10/2006 | Li et al. |
| 2007/0089034 | A1 | 4/2007 | Litsyn et al. |
| 2007/0171714 | A1 | 7/2007 | Wu et al. |
| 2007/0189073 | A1 | 8/2007 | Aritome |
| 2007/0208905 | A1 | 9/2007 | Litsyn et al. |
| 2007/0300130 | A1 | 12/2007 | Gorobets |
| 2008/0019188 | A1 | 1/2008 | Li |
| 2008/0092014 | A1 * | 4/2008 | Brandman et al. ........... 714/763 |
| 2008/0092015 | A1 * | 4/2008 | Brandman et al. ........... 714/763 |
| 2008/0092026 | A1 * | 4/2008 | Brandman et al. ........... 714/793 |
| 2008/0109703 | A1 * | 5/2008 | Brandman ................ 714/763 |
| 2008/0123420 | A1 * | 5/2008 | Brandman et al. ....... 365/185.09 |
| 2008/0151617 | A1 * | 6/2008 | Alrod et al. ............... 365/185.2 |
| 2008/0162791 | A1 | 7/2008 | Eldredge |
| 2008/0244360 | A1 | 10/2008 | Mokhlesi et al. |
| 2008/0291724 | A1 | 11/2008 | Litsyn et al. |
| 2009/0024905 | A1 | 1/2009 | Shalvi et al. |
| 2009/0043951 | A1 | 2/2009 | Shalvi et al. |
| 2009/0067237 | A1 | 3/2009 | Lee |
| 2009/0234792 | A1 * | 9/2009 | Kim et al. ................ 706/50 |
| 2009/0241008 | A1 | 9/2009 | Kim et al. |
| 2009/0241009 | A1 | 9/2009 | Kong et al. |
| 2009/0310406 | A1 | 12/2009 | Sarin et al. |
| 2009/0319868 | A1 | 12/2009 | Sharon et al. |
| 2011/0145487 | A1 | 6/2011 | Haratsch et al. |
| 2011/0145681 | A1 | 6/2011 | Yang |
| 2011/0167305 | A1 | 7/2011 | Haratsch et al. |
| 2011/0225350 | A1 | 9/2011 | Burger, Jr. et al. |
| 2011/0305082 | A1 | 12/2011 | Haratsch et al. |
| 2012/0163085 | A1 | 6/2012 | Alrod et al. |
| 2014/0059406 | A1 | 2/2014 | Hyun et al. |
| 2015/0058536 | A1 | 2/2015 | Seol et al. |

FOREIGN PATENT DOCUMENTS

| | | | | |
|---|---|---|---|---|
| JP | 2006114078 | A2 * | 4/2006 | |
| JP | WO 2007149678 | A2 * | 12/2007 | ......... G11C 11/5628 |
| WO | WO 03100791 | A1 * | 12/2003 | ......... G06F 11/1012 |
| WO | WO 2007132453 | A2 * | 11/2007 | ......... G11C 16/26 |
| WO | WO 2008019347 | A2 * | 2/2008 | ......... G11C 11/56 |
| WO | WO 2008042593 | A1 * | 4/2008 | ......... G06F 11/1008 |
| WO | 2008053472 | | 5/2008 | |
| WO | WO 2008057822 | A2 * | 5/2008 | ......... G11C 11/5642 |

OTHER PUBLICATIONS

Marandian, M.; Salehi, M., "Low Complexity Iterative Decision Feedback Equalizer for 8PSK Modulation in Time Dispersive Channels," 12$^{th}$ IEEE International Symposium on Personal, Indoor and Mobile Radio Communications, Sep. 30-Oct. 3, 2001, vol. 1, pp. A-102-A-106.*
Xiao Li Yi; Zhu Ming; Zhang Yan Jing; Luo Hong Wei, "Design EG-LDPC Codes for Soft Error Mitigation in Memory," 2011 Academic International Symposium on Optoelectronics and Microelectronics Technology (AISOMT), Oct. 12-16, 2011, pp. 328-332.*
Wu et al., "Single-Read Based Soft-Decision Decoding of Non-Volatile Memory," U.S. Appl. No. 13/567,024, filed Aug. 4, 2012.
Chen et al., "Flash Memory Read Scrub and Channel Tracking," U.S. Appl. No. 13/597,489, filed Aug. 29, 2012.

* cited by examiner

500

600

| BIT PROGRAMMED/BIT READ | 0 | 1 |
|---|---|---|
| 0 | 0.998 | 0.002 |
| 1 | 0.003 | 0.997 |

700

| SYMBOL PROGRAMMED/ SYMBOL READ | 11 | 01 | 00 | 10 |
|---|---|---|---|---|
| 11 | 0.990 | 6.0e-3 | 3.5e-3 | 5.0e-4 |
| 01 | 3.0e-3 | 0.985 | 1.2e-2 | 0 |
| 00 | 4.0e-3 | 1.2e-2 | 0.983 | 1.0e-3 |
| 10 | 1.0e-3 | 4.0e-4 | 9.6e-3 | 0.989 |

| SYMBOL WRITTEN (AGGRESSOR PATTERN)/ SYMBOL READ | 11 | 01 | 00 | 10 |
|---|---|---|---|---|
| 11 (11) | 0.24 | 4e-3 | 0 | 0 |
| 11 (01) | 0.25 | 2e-3 | 0 | 0 |
| 11 (00) | 0.25 | 2e-3 | 1e-3 | 0 |
| 11 (10) | 0.25 | 1e-3 | 0 | 0 |
| 01 (11) | 0 | 0.25 | 1e-3 | 0 |
| 01 (01) | 2e-3 | 0.245 | 2e-3 | 3e-3 |
| 01 (00) | 0 | 0.25 | 1e-3 | 0 |
| 01 (10) | 1e-3 | 0.242 | 1e-3 | 2e-3 |
| 00 (11) | 2e-3 | 5e-3 | 0.24 | 1e-3 |
| 00 (01) | 0 | 1e-3 | 0.25 | 2e-3 |
| 00 (00) | 0 | 3e-3 | 0.25 | 1e-3 |
| 00 (10) | 1e-3 | 2e-3 | 0.24 | 2e-3 |
| 10 (11) | 1e-3 | 0 | 7e-3 | 0.243 |
| 10 (01) | 0 | 0 | 2e-3 | 0.249 |
| 10 (00) | 0 | 2e-3 | 2e-3 | 0.243 |
| 10 (10) | 1e-3 | 0 | 2e-3 | 0.248 |

CELL-LEVEL STATISTICS COLLECTION FOR DETECTION AND DECODING IN FLASH MEMORIES

CROSS-REFERENCE TO RELATED APPLICATIONS

The present application is a continuation-in-part patent application of U.S. patent application Ser. No. 13/063,888, filed Aug. 31, 2011, entitled "Methods and Apparatus for Soft Data Generation in Flash Memories," mow U.S. Pat. No. 8,830,748); U.S. patent application Ser. No. 13/063,895, filed May 31, 2011 (published as United States Patent Publication No. 2011/0225350), entitled "Methods and Apparatus for Soft Data Generation for Memory Devices Using Reference Cells," (now U.S. Pat. No. 9,378,835); U.S. patent application Ser. No. 13/063,899, filed May 31, 2011, entitled "Methods and Apparatus for Soft Data Generation for Memory Devices Using Decoder Performance Feedback," (now U.S. Pat. No. 8,892,966); U.S. patent application Ser. No. 13/063,874, filed Mar. 14, 2011, entitled "Methods and Apparatus for Soft Data Generation for Memory Devices Based on Performance Factor Adjustment;" (now U.S. Pat. No. 9,064,594); and U.S. patent application Ser. No. 13/731,766, filed Dec. 31, 2012, entitled "Detection and Decoding in Flash Memories Using Correlation of Neighboring Bits," (now U.S. Pat. No. 9,292,377) each incorporated by reference herein.

FIELD

The present invention relates generally to flash memory devices and more particularly, to improved techniques for mitigating the effect of noise, inter-cell interference (ICI) and other distortions in such flash memory devices with low overall processing delay.

BACKGROUND

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

The analog values stored in memory cells are often distorted. The distortions are typically due to, for example, back pattern dependency (BPD), noise and inter-cell interference (ICI). A number of techniques have been proposed or suggested for mitigating the effect of ICI by reducing the capacitive coupling between cells. While there are available methods to reduce the effect of ICI, it is important that such ICI mitigation techniques do not unnecessarily impair the write-read speeds for flash controllers. Thus, many effective signal processing and decoding techniques are avoided that would introduce significant inherent processing delays. Foregoing such complex signal processing techniques, however, reduces the ability of a flash controller to maintain sufficient decoding accuracy as flash device geometries scale down.

It has been found that errors for neighboring bits in the pages of flash memory devices are correlated. A need therefore exists for detection and decoding techniques to combat errors that do not unnecessarily impair the read speeds for flash controllers. A further need exists for detection and decoding techniques that account for such error correlations.

SUMMARY

Generally, methods and apparatus are provided for collecting cell-level statistics for detection and decoding in flash memories. According to one embodiment of the invention, data from a flash memory device is processed by obtaining one or more read values for a plurality of bits in a page of the flash memory device; and generating cell-level statistics for the flash memory device based on a probability that a data pattern was read from the plurality of bits given that a particular pattern was written to the plurality of bits.

According to another embodiment of the invention, the cell-level statistics are optionally generated substantially simultaneously with a reading of the one or more read values, for example, as part of a read scrub process. According to a further embodiment of the invention, the cell-level statistics can be used to convert the one or more read values for the plurality of bits to a reliability value for a bit among the plurality of bits.

The cell-level statistics are optionally collected in a location-dependent manner. The cell-level statistics can be based on a number of errors from each state to another state divided by a total count of each state. In one embodiment, the cell-level statistics comprise pattern-dependent cell-level statistics for a victim cell and at least one aggressor cell of the flash memory device.

A more complete understanding of the present invention, as well as further features, aspects, embodiments and advantages of the present invention, will be obtained by reference to the following detailed description, claims and drawings.

BRIEF DESCRIPTION OF THE DRAWINGS

FIG. 10 illustrates an exemplary aggressor-pattern cell-level statistics table where the statistics are normalized by the total number of cells;

DETAILED DESCRIPTION

Figure 1:
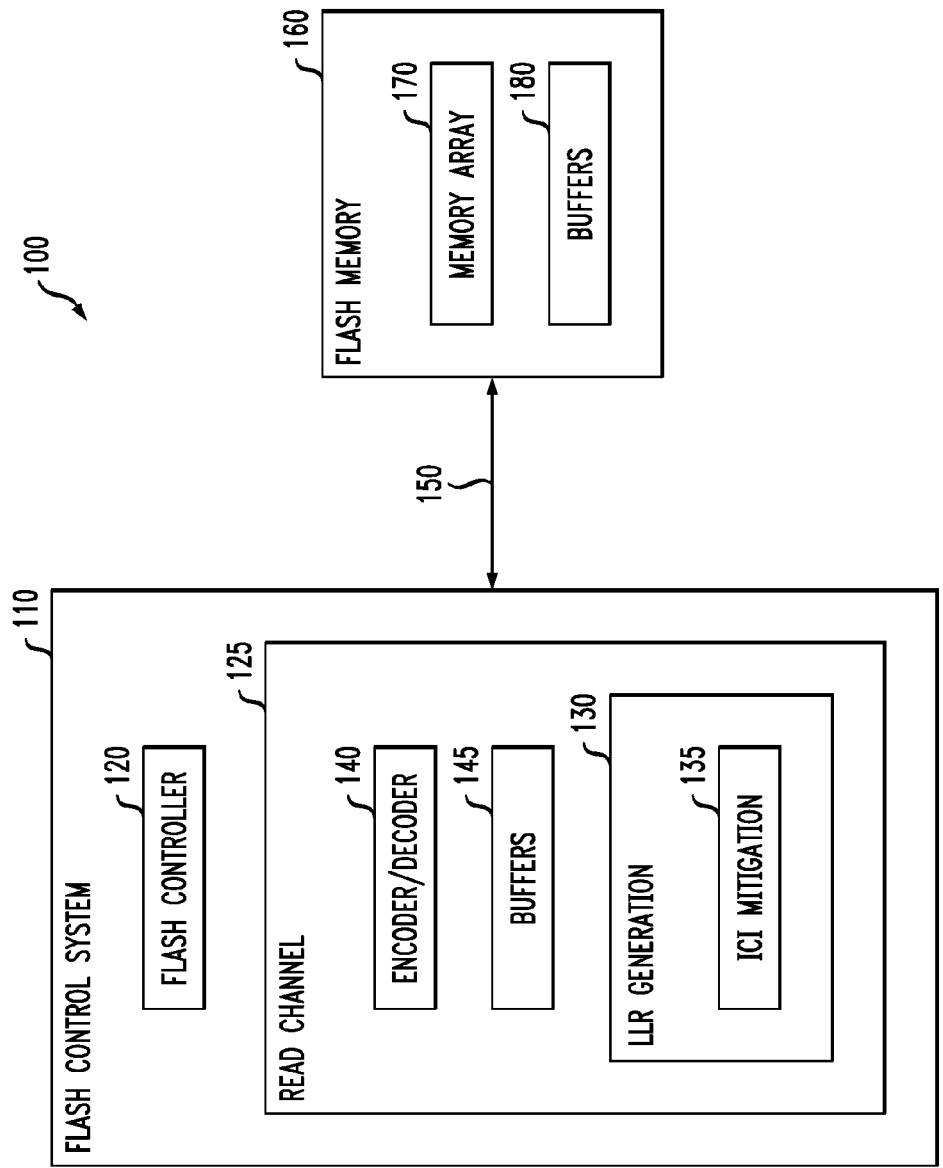
FIG. 1 is a schematic block diagram of an exemplary flash memory system incorporating detection and decoding techniques in accordance with the present invention.

Various aspects of the invention are directed to signal processing techniques, and in particular, detection and coding techniques for mitigating ICI and other distortions in memory devices, such as single-level cell (SLC) or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for flash memories, such as the use of voltages or currents to represent stored data, as would be apparent to a person of ordinary skill in the art.

Aspects of the present invention provide techniques for collecting and managing cell-level statistics in flash memories that store multiple bits per cell. In such flash memories, cell-level statistics provide additional channel information on the transition probability from one state to any other state, relative to bit-level statistics, and therefore can help improve ECC decoding performance. In addition, if multiple word lines are included in the proposed method, aggressor-pattern-dependent statistics can also be collected, which helps inter-cell interference mitigation.

Detection and decoding techniques with error processing do not unnecessarily impair the read speeds for flash read channels. According to one aspect of the invention, detection and decoding techniques are provided that account for error correlations between neighboring bits. A log likelihood ratio (LLR) for a given bit is generated in a normal mode based on a probability that a given data pattern was written to one or more bits when a particular pattern was read. A log likelihood ratio is generated in a normal mode based on a probability that a given data pattern was written to a plurality of bits when a particular pattern was read from the plurality of bits. As used herein, the term "ICI mitigation" includes the mitigation of ICI and other distortions. Also, the term "LLR" includes also an approximation of an LLR, reliability value or other measures for reliability.

According to one aspect of the invention, failed pages in a flash device can be recovered by joint decoding of multiple pages in a given wordline even if the individual pages are encoded independently. Aspects of the invention recognize that as long as pages are encoded using the same binary generator matrix, the corresponding individual parity check matrices for decoding can be joined into a single non-binary parity check matrix given that all its non-zero elements are the unity Galois field element, as discussed further below. Moreover, although an example is given here only for two pages per wordline, the same approach can be applied by anyone with ordinary skill in the art to any number of pages per wordline, by replicating binary LDPC decoders so that the number of decoders equals the number of pages. In addition, the same approach can be applied to any number of pages in different wordlines that are correlated in any measurable way.

In one exemplary embodiment, a given page is independently decoded on-the-fly during a normal operating mode using the parity check matrix that corresponds to the given page. If the page fails to decode during the normal mode, then additional pages in the same wordline are read, and the symbol reliabilities for the wordline are generated and passed to the LDPC decoder. In another embodiment, when a page fails to decode in the normal mode, additional pages in other wordlines are also read that cause ICI in the current wordline, and the symbol probabilities are passed to the LDPC decoder. According to a further aspect of the invention, the LDPC decoder is a hybrid decoder that supports both individual page decoding and joint wordline decoding due to the structure of the disclosed non-binary parity check matrix.

FIG. 1 is a schematic block diagram of an exemplary flash memory system 100 incorporating noise and ICI mitigation techniques in accordance with aspects of the present invention. As shown in FIG. 1, the exemplary flash memory system 100 comprises a flash control system 110 and a flash memory block 160, connected by an interface 150. The exemplary flash control system 110 comprises a flash controller 120, and a read channel 125. Moreover, the read channel 125 further comprises an encoder/decoder 140, buffers 145 and an LLR generation block 130. Finally, the LLR generation block 130 further comprises an ICI mitigation block 135.

As discussed further below in conjunction with FIG. 4, the exemplary flash controller 120 implements one or more detection and decoding processes that incorporate aspects of the present invention.

The exemplary read channel 125 comprises an encoder/decoder block 140 and one or more buffers 145. It is noted that the term "read channel" can encompass the write channel as well. In an alternative embodiment, the encoder/decoder block 140 and some buffers 145 may be implemented inside the flash controller 120. The encoder/decoder block 140 and buffers 145 may be implemented, for example, using well-known commercially available techniques and/or products, as modified herein to provide the features and functions of the present invention.

Generally, as discussed further below, the exemplary LLR generation block 130 processes one or more read values from the flash memory 160, such as single bit hard values and/or quantized multi-bit soft values, and generates LLR values that are applied to the decoder 140, such as an exemplary low density parity check (LPDC) decoder.

Generally, as discussed further below, the exemplary ICI mitigation block 135 is a specialized function in the LLR generation block 130 that accounts for interference between physically adjacent cells in generating the LLR sequence.

The exemplary flash memory block 160 comprises a memory array 170 and one or more buffers 180 that may each be implemented using well-known commercially available techniques and/or products.

In various embodiments of the disclosed detection and decoding techniques, the exemplary interface 150 may need to convey additional information relative to a conventional flash memory system, such as values representing information associated with aggressor cells. Thus, the interface 150 may need to have a higher capacity or faster rate than an interface in conventional flash memory systems. On the other hand, in other embodiments, this additional information is conveyed to flash controller 120 in a sequential manner which would incur additional delays. However those additional delays do not notably increase the overall delay due to their rare occurrence. When additional capacity is desired, the interface 150 may optionally be implemented, for example, in accordance with the teachings of International PCT Patent Application Serial No. PCT/US09/49328, filed Jun. 30, 2009 (published as PCT Patent Publication No. WO2010002943 A1), entitled "Methods and Apparatus for Interfacing Between a Flash Memory Controller and a Flash Memory Array," incorporated by reference herein, which increases the information-carrying capacity of the interface 150 using, for example, Double Data Rate (DDR) techniques.

During a write operation, the interface 150 transfers the program values to be stored in the target cells, typically using page or wordline level access techniques. For a more detailed discussion of exemplary page or wordline level access techniques, see, for example, International Patent Application Serial No. PCT/US09/36810, filed Mar. 11 (published as PCT Patent Publication No. WO2009114618 A1), 2009, entitled "Methods and Apparatus for Storing Data in a Multi-Level Cell Flash Memory Device with Cross-Page Sectors, Multi-Page Coding and Per-Page Coding," incorporated by reference herein.

During a read operation, the interface 150 transfers hard and/or soft read values that have been obtained from the memory array 170 for target and/or aggressor cells. For example, in addition to read values for the page with the target cell, read values for one or more neighboring pages in neighboring wordlines or neighboring even or odd bit lines are transferred over the interface 150. In the embodiment of FIG. 1, the disclosed detection and decoding techniques are implemented outside the flash memory 160, typically in a process technology optimized for logic circuits to achieve the lowest area. It is at the expense, however, of the additional aggressor cell data that must be transferred on the interface 150.

Figure 2:
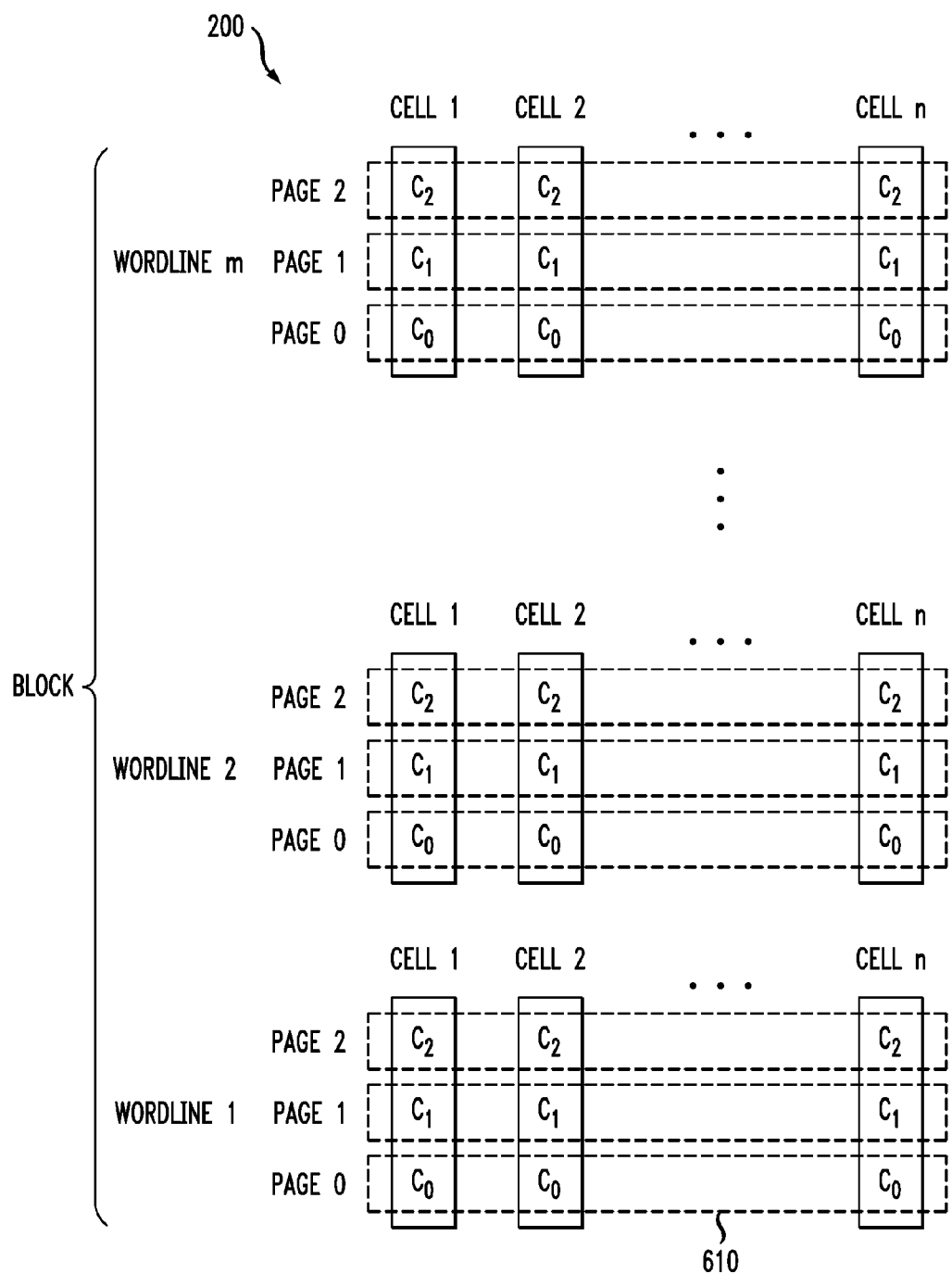
FIG. 2 illustrates an exemplary flash cell array in a multi-level cell (MLC) flash memory device in further detail.

FIG. 2 illustrates an exemplary flash cell array 200 in a multi-level cell (MLC) flash memory device 160 in further detail. As shown in FIG. 2, the exemplary flash cell array 200 stores three bits per flash cell, $c_i$. FIG. 2 illustrates the flash cell array architecture for one block, where each exemplary cell typically corresponds to a floating-gate transistor that stores three bits. The exemplary cell array 200 comprises m wordlines and n bitlines. Typically, in current multi-page cell flash memories, the bits within a single cell belong to different pages. In the example of FIG. 2, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where, for example, cells with even numbers (such as cells 2 and 4 in FIG. 2) correspond to even pages, and cells with odd numbers (such as cells 1 and 3 in FIG. 2) correspond to odd pages. In this case, a page (such as page 0) would contain an even page (even page 0) in even cells and an odd page (odd page 0) in odd cells.

In a multi-level cell, for example, each cell stores two bits. In one exemplary implementation, Gray mapping {11, 01, 00, 10} is employed where bits in a cell belong to two different pages. The bits for the two pages in each cell are often referred to as the least significant bit (LSB) and the most significant bit (MSB). For example, for the pattern 01 that is stored in a two-bit-per-cell flash cell, "1" refers to the LSB or lower page, and "0" refers to the MSB or upper page. Experimental studies of flash memory devices indicate that the error event "01"→"10" has considerable occurrence probability at the end of device life. In addition, based on an additive white Gaussian noise (AWGN) model, the MSB page often exhibits a higher bit error rate (BER) compared to the LSB page. Thus, it has been found that reading one page improves the BER of the other.

Thus, MSB and LSB errors are known to have statistical correlation at the end of device life relative to anew flash memory device. Thus, aspects of the present invention provide joint decoding on a non-binary field of LSB and MSB pages of a given wordline in the recovery mode, while also being able to decode LSB and MSB pages independently on the binary field in the normal mode.

Intercell Interference

Figure 3:
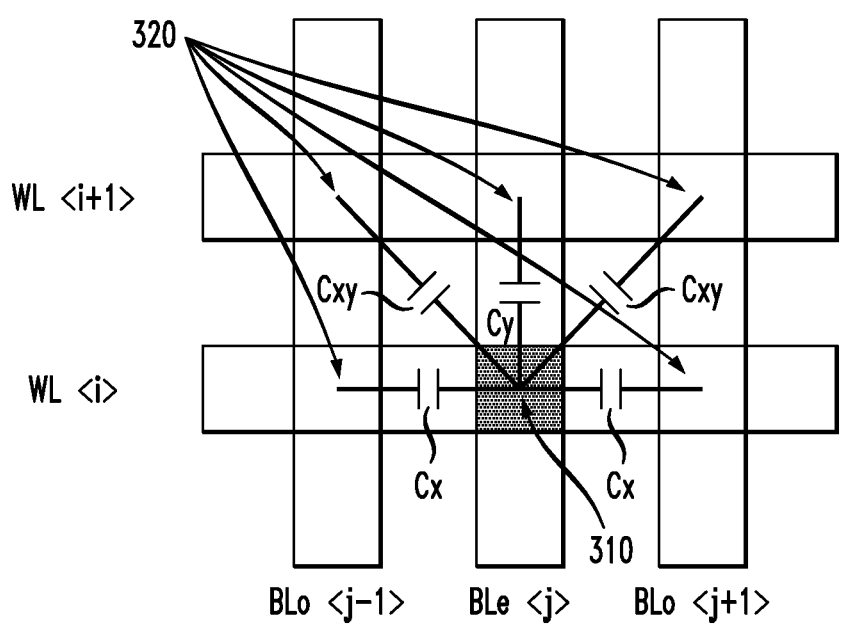
FIG. 3 illustrates the ICI that is present for a target cell due to the parasitic capacitance from a number of exemplary aggressor cells.

ICI is a consequence of parasitic capacitances between cells and is generally considered to be one of the most prominent sources of distortion. FIG. 3 illustrates the ICI that is present for a target cell 310 due to the parasitic capacitance from a number of exemplary aggressor cells 320. The following notations are employed in FIG. 3:
 WL: wordline;
 BL: bitline;
 BLo: odd bitline;
 BLe: even bitline; and
 C: capacitance.

Aspects of the present invention recognize that ICI is caused by aggressor cells 320 that are programmed after the target cell 310 has been programmed. The ICI changes the voltage, $V_t$, of the target cell 310. In one exemplary embodiment, a "bottom up" programming scheme is assumed and adjacent aggressor cells in wordlines i and i+1 cause ICI for the target cell 310. With such bottom-up programming of a block, ICI from the lower wordline i−1 is removed, and up to five neighboring cells contribute to ICI as aggressor cells 320, as shown in FIG. 3. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells are considered. Other cells that are further away from the target cell can be neglected, if their contribution to ICI is negligible. In general, the aggressor cells 320 are identified by analyzing the programming sequence scheme (such as bottom up or even/odd techniques) to identify the aggressor cells 320 that are programmed after a given target cell 310.

The ICI caused by the aggressor cells 320 on the target cell 310 can be modeled in the exemplary embodiment as follows:

$$\Delta V_{ICI}^{(i,j)} = k_x \Delta V_t^{(i,j-1)} + k_x \Delta V_t^{(i,j+1)} + k_y \Delta V_t^{(i+1,j)} + k_{xy} \Delta V_t^{(i+1,j-1)} + k_{xy} \Delta V_t^{(i+1,j+1)} \quad (1)$$

where $\Delta V_t^{(w,b)}$ is the change in $V_t$ voltage of agressor cell (w,b), $\Delta V_{ICI}^{(i,j)}$ is the change in $V_t$ voltage of target cell (i,j) due to ICI and $k_x$, $k_y$ and $k_{xy}$ are capacitive coupling coefficients for the x, y and xy direction.

Generally, $V_t$ is the voltage representing the data stored on a cell and obtained during a read operation. $V_t$ can be obtained by a read operation, for example, as a soft voltage value with more precision than the number of bits stored per cell when all pages in a wordline are read, or with two or more bits when only one page in a wordline is read, or as a value quantized to a hard voltage level with the same resolution as the number of bits stored per cell (e.g., 3 bits for 3 bits/cell flash) when all pages in a wordline are read, or a value quantized to one hard bit when only one page in a wordline is read.

For a more detailed discussion of distortion in flash memory devices, see, for example, J. D. Lee et al., "Effects of Floating-Gate Interference on NAND Flash Memory Cell Operation." IEEE Electron Device Letters, 264-266 (May 2002) or Ki-Tae Park, et al., "A Zeroing Cell-to-Cell Interference Page Architecture With Temporary LSB Storing and Parallel MSB Program Scheme for MLC NAND Flash Memories." IEEE J. of Solid State Circuits. Vol. 43, No. 4, 919-928, (April 2008), each incorporated by reference herein.

Figure 4:
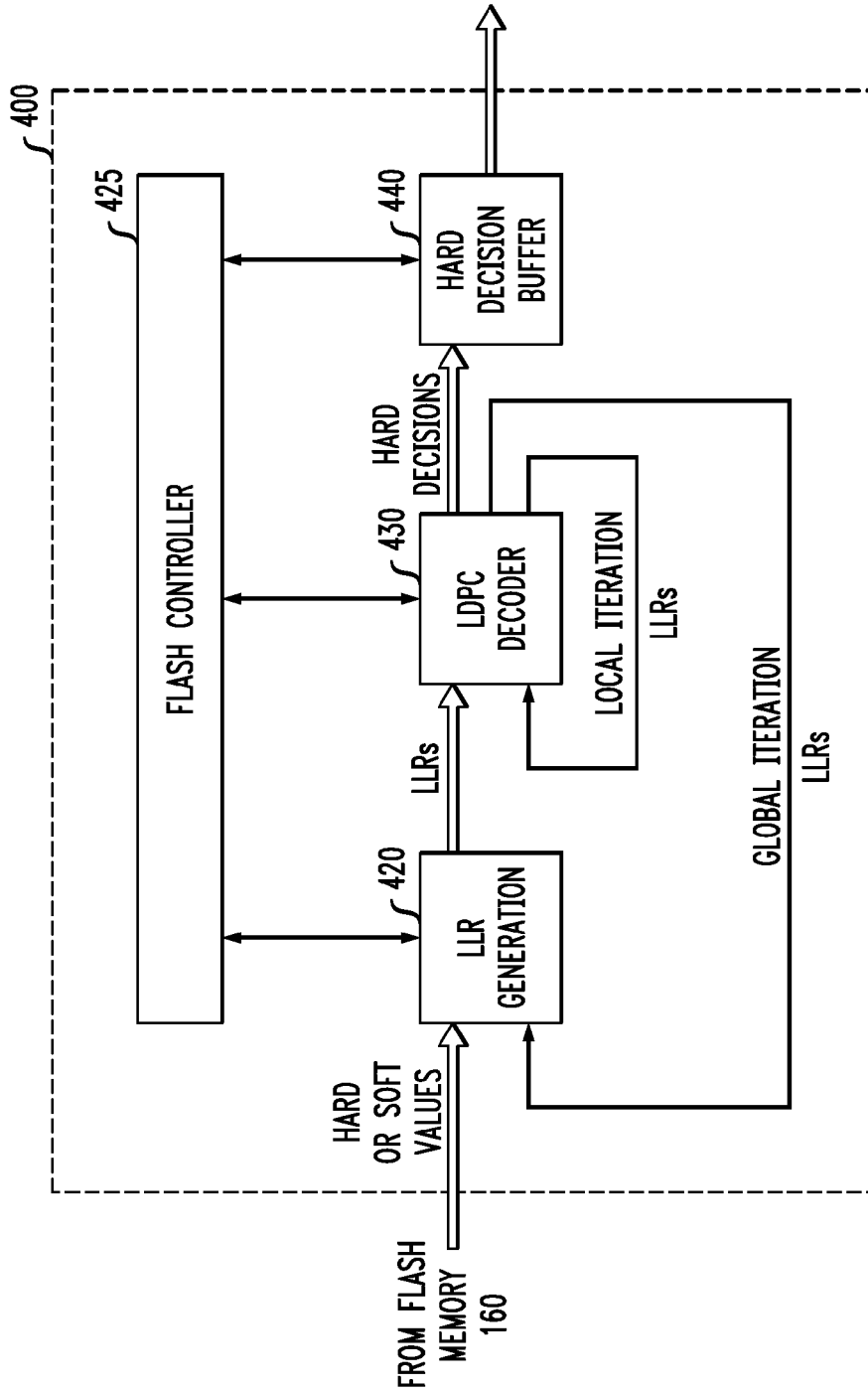
FIG. 4 is a schematic block diagram of an exemplary implementation of a flash memory system incorporating detection and decoding techniques in accordance with aspects of the present invention.

FIG. 4 is a schematic block diagram of an exemplary implementation of a flash memory system 400 incorporating detection and decoding techniques in accordance with aspects of the present invention. As shown in FIG. 4, one or more read values are obtained from the memory array 170 of the flash memory 160. The read values may be, for example, a hard value or a soft value. In a normal mode, for example a read value is obtained for at least one bit in a given page.

In a given processing mode, such as a normal mode or a recovery mode, an exemplary LLR generation block 420 processes the read values from the flash memory 160, such as single bit hard values and/or quantized multi-bit soft values, and generates LLR values that are applied to an exemplary LPDC decoder 430. The LLR generation performed by the exemplary LLR generation block 420 for each mode of the exemplary detection and decoding is discussed further below in a section entitled "LLR generation." The LLR generation block 420 is an example of a reliability unit.

An exemplary flash controller 425 implements one or more detection and decoding processes that incorporate aspects of the present invention. In addition, as discussed further below, an exemplary LDPC decoder 430 processes the LLRs generated by the exemplary LLR generation block 420 and provides hard decisions that are stored in hard decision buffers 440.

As discussed further below, the exemplary LDPC decoder 430 can iteratively decode the LLR values, e.g., until the read values are successfully decoded. Iterations inside the LDPC decoder 430 are called local iterations. In these local iterations, LLRs are being updated inside the LDPC decoder using one or more iterations of a message passing algorithm. In addition, as discussed further below, in an exemplary recovery mode, the exemplary LLR generation block 420 and the exemplary LDPC decoder 430 can globally iterate until the read values are successfully decoded. In a global iteration, the LLR generation block 420 provides LLRs to the LDPC decoder 430. After local iterations within the LDPC decoder 430, the LDPC decoder 430 then provides updated LLRs to the LLR generation block 420. The LLR generation block 420 uses these LLRs from the LDPC decoder 430 to compute updated LLRs, which are provided to the LDPC decoder 430. One loop of LLR updates through the LLR generation block 420 and LDPC decoder 430 is called one global iteration. In an iterative detection and decoding system, several local and/or several global iterations are being performed until the data corresponding to a codeword has been successfully detected and decoded. For a more detailed discussion of iterative detection and decoding using local and global iterations, see, for example, U.S. patent application Ser. No. 13/063,888, filed Mar. 14, 2011, entitled "Methods and Apparatus for Soft Data Generation in Flash Memories," (now U.S. Pat. No. 8,830,748), incorporated by reference herein. The LLR generation block 420 is an example of a reliability value generation unit.

An MLC (multi-level cell) flash memory stores two bits-per-cell with four voltage threshold $V_t$ levels (states). Likewise, a TLC (triple-level cell) stores three bits per cell with eight $V_t$ levels (states). To generalize, an m-bits per cell flash memory device stores m bits per cell with $2^m$ $V_t$ levels. To map m-bit symbols to the $2^m$ $V_t$ levels, Gray mapping is typically used, such that two neighboring $V_t$ levels only differ in one bit out of the m bits.

Figures 5, 6, 7:
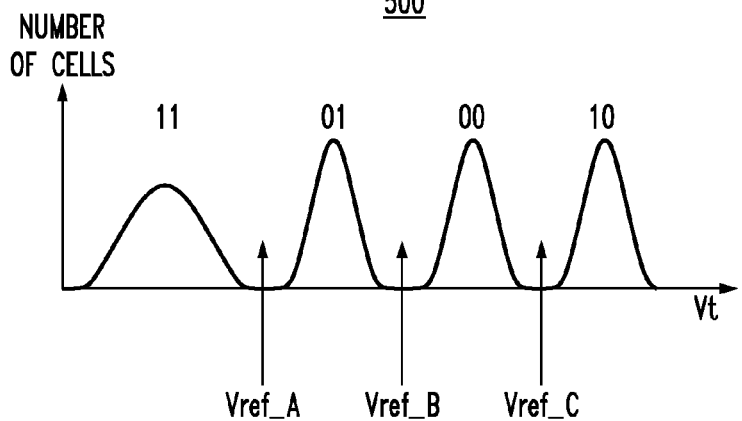
FIG. 5 illustrates an exemplary mappin of four two-bit symbols to four $V_t$ levels (states)
FIGS. 6 and 7 illustrate exemplary bit-level and cell-level statistics tables where the statistics are normalized by the total number of bits in a page.

FIG. 5 illustrates an exemplary mapping 500 of four two-bit symbols to four $V_t$ levels (states). Normally, the two bits in each symbol are organized into different pages. In the example of FIG. 5, the LSB (least significant bit) is in the lower page, and the MSB (most significant bit) is in the upper page. FIG. 5 also illustrates that one reference voltage $V_{ref\_B}$ is used to read the lower page bit, while two reference voltages $V_{ref\_A}$ and $V_{ref\_C}$ are used to read the upper page bit.

In addition, as shown in FIG. 5, for a group of cells, the $V_t$ level of all cells that store a given two-bit symbol follows a distribution rather than a fixed value. This is due to various noise sources such as program/erase cycling, retention, program disturb and read disturb. Due to the noise, when reading this group of cells with given reference voltages $V_{ref}$, the LSB (or MSB) of some cells can be read as an incorrect bit. As long as the number of raw read errors are not too severe, the ECC (error correction code) module in the controller 425 will be able to correct these errors and output the successfully corrected bits to the host.

Cell-Level Statistics Versus Bit-Level Statistics

The correction capability of a conventional ECC such as BCH and Reed-Solomon codes is defined by how many bit (or symbol) errors can be corrected. i.e., the error correction power t. If the number of raw bit (or symbol) errors is larger than t, the ECC decoder 430 fails. Otherwise, the decoder 430 succeeds. In such cases, the bit-level statistics are not helpful to the decoder 430. The bit-level statistics are also referred to as page-level statistics because different bits in a cell are organized in different pages. The bit-level statistics includes the number of bits programmed as 0 (or 1) that are read as 1 (or 0). FIG. 6 illustrates an exemplary bit-level statistics table 600 where the statistics are normalized by the total number of bits in a page. The bit-level statistics table is also known as bit-level transition matrix because it defines the transition probability from the programmed bit to the bit that is read out.

As flash memory storage density increases and the technology scales to smaller sizes, soft-decision ECC decoders, such as low-density parity-check (LDPC) decoders, are being increasingly used in flash controllers 425. The input to a soft-decision decoder 430 is a soft-decision metric representing the likelihood of the input bit being a 1 or 0, in the case of a binary decoder. For example, the most widely used input to an LDPC soft decoder 430 is an LLR (log likelihood ratio). For controllers 425 with soft-decision decoders 430, raw bit error statistics can improve the assignment of LLRs and therefore improve the decoding performance. A number of techniques have been proposed or suggested to compute LLRs for hard-decision read decoding given the $V_t$ distribution.

Referring to FIG. 5, assuming perfect randomization, in reading the lower page, if the controller 425 knows that $V_{ref\_B}$ is placed such that the 1→0 probability is asymmetric with the 0→1 probability, the controller 425 can assign an LLR in an asymmetric manner to improve ECC decoding performance.

In FIG. 5, the $V_t$ of each level is modeled to suffer from additive Gaussian noise. In a real flash memory, the noise can be more complicated. For example, transitions between non-adjacent levels can be non-negligible. Cell-level statistics cover error counts from any state to any other state. In MLC, for example, cell-level statistics can be normalized in a certain group (such as a wordline or a block) by the total number of cells, to obtain a cell-level 4×4 transition matrix. With cell-level statistics, LLRs can be assigned to better reflect the flash channel (i.e., $V_t$ distributions) and therefore further improve the decoding performance.

FIG. 7 illustrates an exemplary cell-level statistics table 700 where the statistics are normalized by the total number of cells. The exemplary cell-level statistics table 700 records collected wordline statistics indicating a transition probability for a given pair of bits $a_i b_i$ that represent one cell in a wordline. $a_i$ and $b_i$ refer to the upper (or MSB) page and lower (or LSB) bit of cell i. The size of the cell-level statistics table 700 grows exponentially in the number of pages in a wordline. The error statistics in the exemplary cell-level statistics table 700 can be used to compute 2-bit joint GF(4) LLRs that correspond to the four possible states of an MLC flash cell. For more information on bit transition probability tables, see U.S. patent application Ser. No. 13/731,766, filed Dec. 31, 2012), entitled "Detection and Decoding in Flash Memories Using Correlation of Neighboring Bits," now U.S. Pat. No. 9,292,377, incorporated by reference herein (now U.S. Pat. No. 9,292,377).

An exemplary detection and decoding process uses wordline (cell) access techniques, where the other pages in the wordline are read to generate the corresponding LLRs. In an exemplary embodiment, the LLRs are calculated based on data or error statistics of the adjacent bits in the same cell. The data or error statistics can be collected using reference cells or past LDPC decisions of the pages in the wordline. For a discussion of suitable error statistics collection techniques, see, for example, U.S. patent application Ser. No. 13/063,895, filed May 31, 2011 (published as United States Patent Publication No. 2011/0225350), entitled "Methods and Apparatus for Soft Data Generation for Memory Devices Using Reference Cells," (now U.S. Pat. 9,378,835); and/or U.S. patent application Ser. No. 13/063,899, filed May 31, 2011, entitled "Methods and Apparatus for Soft Data Generation for Memory Devices Using Decoder Performance Feedback," (now U.S. Pat. No. 8,892,966), each incorporated by reference herein.

The exemplary cell-level statistics table 700 records a probability that each possible pattern was written to bits $a_i b_i$ in cell i given that each possible pattern was read (i.e., the reliability of making a decision that a pattern was written given that a pattern was read). For example, the term "p(r=10/w=00)" indicates the probability that the pattern '10' is read as bits $a_i b_i$ given that pattern '00' was written (or the reliability of making an observation '10' given '00' was written). This table can also be used for bits in other cells, such as cell i+1 as would be apparent to a person of ordinary skill in the art.

The statistics in the exemplary cell-level statistics table 700 can be employed to compute LLRs as follows. Assuming perfect randomization and all 4 states have equal a priori probability, given that a particular pattern was read, such as a pattern of '00', the corresponding a posterior symbol log likelihoods can be computed as, $$\lambda(a_i b_i = 00 | r=00) = \log [p(r=00/w=00)] - C,$$
$$\lambda(a_i b_i = 01 | r=00) = \log [p(r=01/w=00)] - C;$$

$$\lambda(a_i b_i = 10 | r=00) = \log [p(r=10/w=00)] - C,$$
$$\lambda(a_i b_i = 11 | r=00) = \log [p(r=11/w=00)] - C,$$

where C is a normalization constant.

The symbol LLRs can then be computed by subtracting the above log likelihoods and the constant C will be cancelled.

For a discussion of LLR generation conditioned on several designated neighboring bits, see, U.S. patent application Ser. No. 13/731,766, filed Dec. 31, 2012, entitled "Detection and Decoding in Flash Memories Using Correlation of Neighboring Bits," now U.S. Pat. No. 9,292,377, incorporated by reference herein.

In a further variation, the exemplary cell-level statistics table 700 can be a function of one or more performance factors, such as endurance, number of program/erase cycles, number of read cycles, retention time, temperature, temperature changes, process corner, ICI impact, location within the memory array 170, location of wordline and/or page from which the read values are obtained, location of page within wordline from which the read values are obtained and a pattern of aggressor cells. One or more of the performance factors can be varied for one or more different bits within a cell, different pages within a wordline, different bit lines or different hard read data values. For a more detailed discussion of suitable techniques for computing a log likelihood ratio for memory devices based on such performance factor adjustments, see, for example, International Patent Application Serial No. PCT/US09/59069, filed Sep. 30, 2009 (published as PCT Patent Publication No. WO201039859 A1), entitled "Methods and Apparatus for Soft Data Generation for Memory Devices Based on Performance Factor Adjustment," incorporated by reference herein.

Aspects of the present invention recognize that the collection of cell-level statistics requires reading multiple pages within the same word line. According to one aspect of the invention, a systematic method is provided for collecting, storing and using cell-level statistics in a controller 425. In one exemplary embodiment, a background task referred to as read scrub is employed for collection of cell-level statistics. A read scrub process is used in memory devices to read data periodically and to prevent ECC correctable errors from accumulating into uncorrectable errors.

Collection and Storage of Cell-Level Statistics

Figure 8:
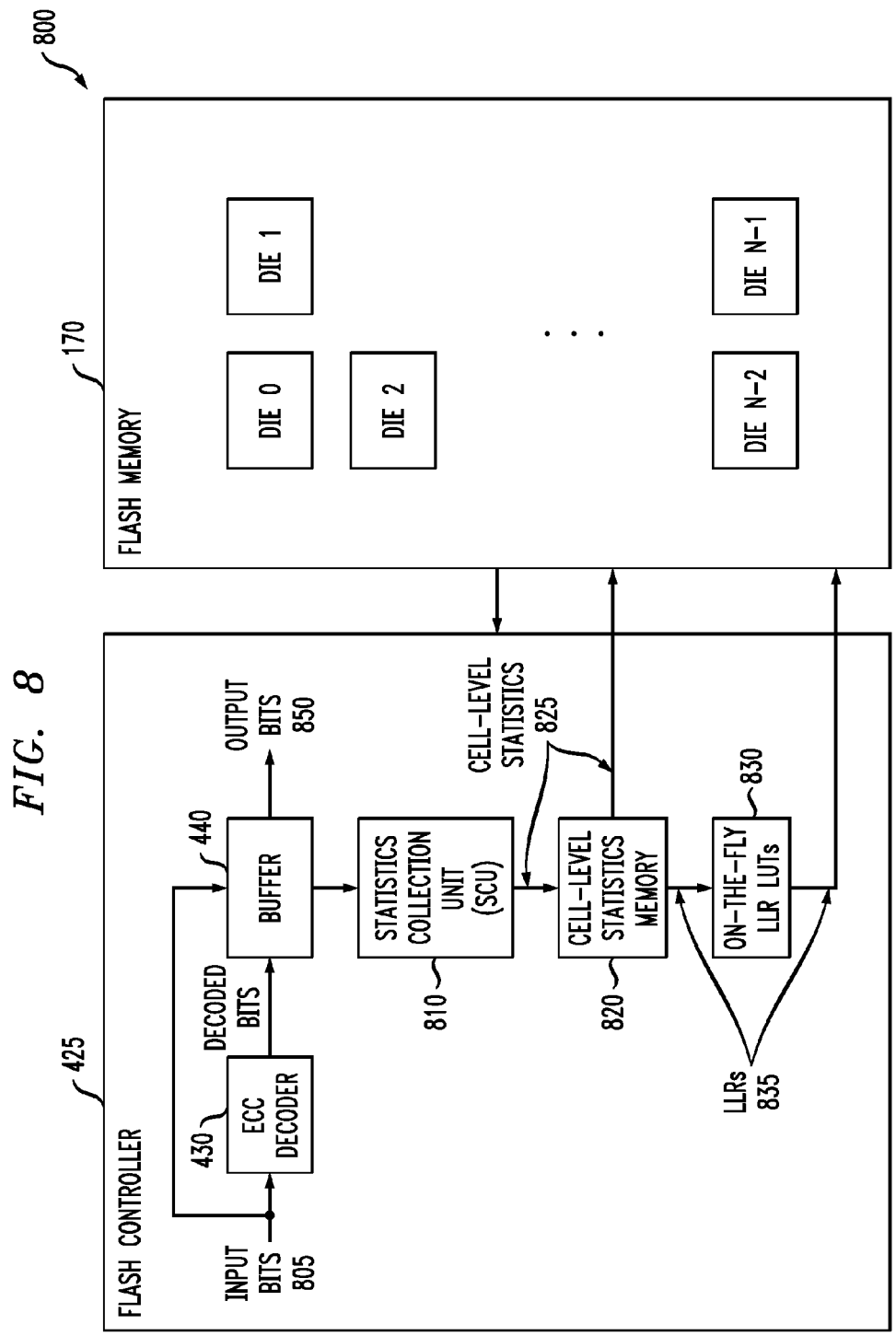
FIG. 8 is a schematic block diagram of an exemplary implementation of a flash memory system incorporating cell-level statistics collection techniques in accordance with aspects of the present invention.

One exemplary embodiment collects cell-level statistics during a read scrub process. FIG. 8 is a schematic block diagram of an exemplary implementation of a flash memory system 800 incorporating cell-level statistics collection techniques in accordance with aspects of the present invention. As shown in FIG. 8, a decoder 430 takes raw input bits 805 and outputs corrected bits 850, both of which are stored in a buffer 440. A statistics collection unit (SCU) 810 reads raw bits 805 and decoded bits 850 in both the lower page and upper page in a word line to obtain cell-level statistics. Depending on the storage granularity of cell-level statistics, after enough (as as many as possible) samples have been collected within the anularity (e.g., a block), the SCU 810 processes the statistics by averaging the statistics over all samples within the granularity. The SCU 810 may further process the statistics to meet some other requirements, e.g., minimum storage. Another example of processing is that the SCU 810 can normalize the counts to obtain a transition matrix as shown in FIG. 7. The controller 425 maintains cell-level statistics 825 on chip in a memory 820, which can be updated after new statistics are collected. Another decoder related parameter to optionally be updated with cell-level statistics are LLRs 835 that are optionally stored in an on-the-fly LLR look-up table (LUT) 830, which is a look-up table to map hard-decision input bits (0 or 1) to a soft metric input suitable for soft-decision ECC decoder 430, such as a low density parity check (LDPC) decoder. As discussed further below, since there are a limited number of possible hard-decision input bits, this mapping can be done using a look-up table (LUT), referred to as an LLR LUT.

Since on-the-fly computing of such LLRs 835 is time-consuming and has a negative impact on throughput performance, the LLRs are optionally updated during a read scrub process together with cell-level statistics. Both the cell-level statistics 825 and the on-the-fly LLRs 835 optionally have a slightly older copy stored in the flash memory 170, so that they can be loaded rather than re-collected when the controller 425 powers up.

Figure 9:
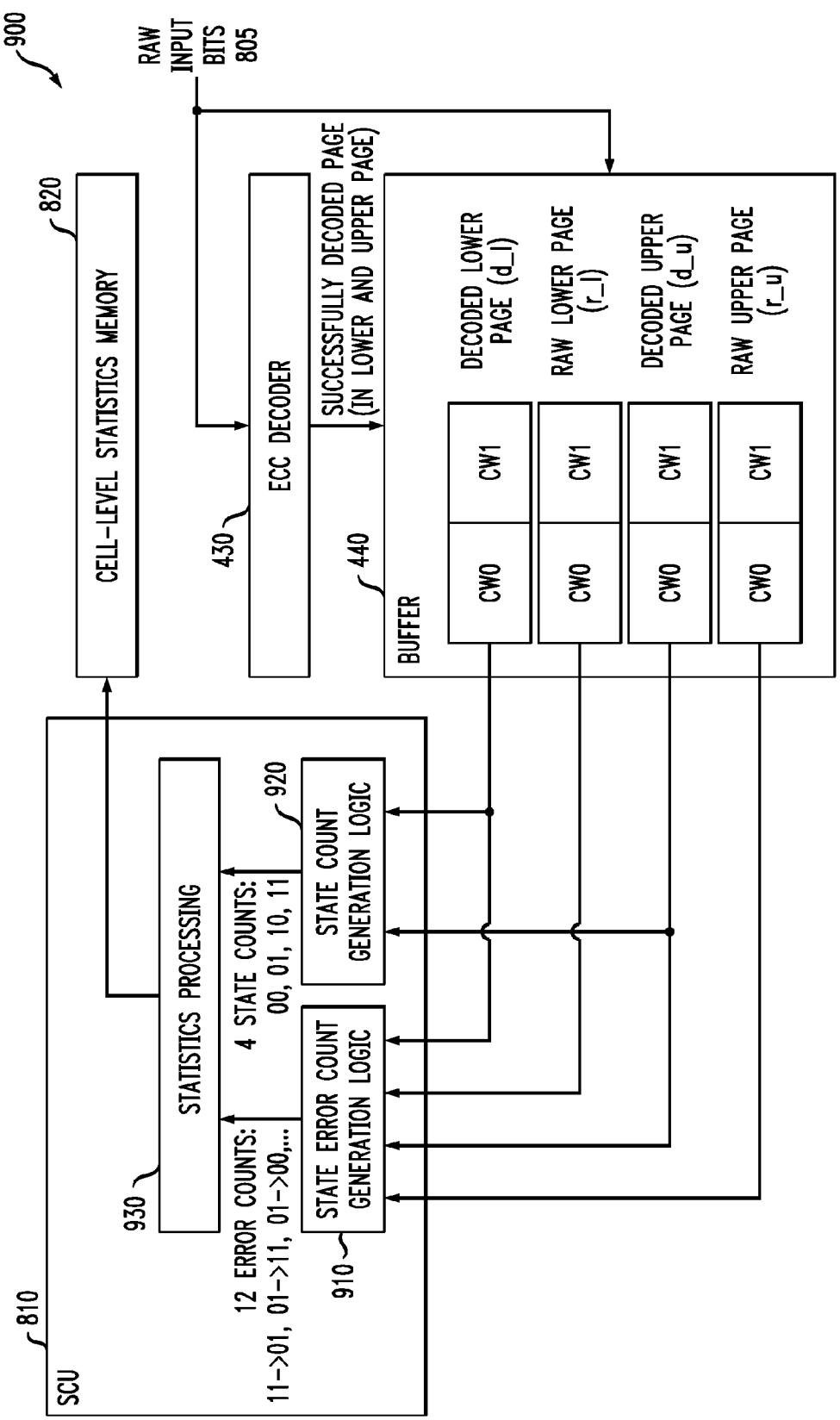
FIG. 9 illustrates an exemplary block diagram of a statistics collection system.

A read scrub process typically performs sequential reads within a block of memory. The buffer 440 should be large enough such that lower page and upper page (in MLC) from the same word line both reside in the buffer 440 when the SCU 810 starts to read them. FIG. 9 illustrates an exemplary block diagram of a statistics collection system 900 comprising the statistics collection unit 810 of FIG. 8 in further detail. The statistics collection unit 810 collects cell-level statistics 825 from four inputs: decoded lower page (d_l), raw lower page (r_l), decoded upper page (d_u), and raw upper page (r_u). A first counter 910 counts the number of errors from each state to another state, and a second counter 920 counts the total counts of each state. For instance, if d_l=1, r_l=0, d_u=1, r_u=1, then the count of 11→10 errors is incremented by 1.

In one exemplary embodiment, the statistics storage granularity is one block. After statistics from one block are collected, the SCU 810 can then process them using block 930 by dividing the error counts by the total counts of each state, to obtain the transition matrix 700 that is stored in cell-level statistics memory 820. Although there are 16 entries in the table 700, only 12 of them are independent, because the sum of entries in each row is 1.0. For example, the SCU 810 can discard the diagonal entries and only store the remaining 12 entries into the cell-level statistics memory 830.

As shown in FIG. 9, the exemplary ECC decoder 430 operates on an ECC codeword level. If a page contains multiple codevvords (two exemplary codewords per page are shown in FIG. 9) and all of them are decoded successfully and transferred to the buffer 440, the SCU 810 can then collect statistics over the entire word line. If a codeword was not decoded successfully, the decoder output is not reliable and cannot be used for cell-level statistics collection.

Additionally, cell-level statistics 825 can be collected in a location-dependent manner. For example, if the controller 430 has a priori knowledge of which dies/blocks have a high possibility of requiring cell-level statistics, the controller 430 can initiate the collection for such dies/blocks more frequently. In another example, if the lower half and upper half of a block exhibit non-trivially different channel conditions, the controller 430 can collect lower half statistics and upper half statistics separately.

Using Cell-Level Statistics

The collected statistics 825 can be used in host read operations. In an exemplary embodiment, an ECC decoder 430 capable of soft decision decoding (as well as hard-decision decoding) is used, such as an LDPC decoder. Flash memory devices typically only support hard-decision read in on-the-fly operations. Recently, flash memory devices support retry reads or soft reads, which can generate soft-decision input to the decoder 430. Soft reads take longer and has a penalty on the overall read performance. For a discussion of suitable techniques for soft read operations, see U.S. patent application Ser. No. 13/778,860, filed contemporaneously herewith, entitled "Inter-Cell Interference Cancellation in Flash Memories," (now U.S. Pat. No. 8,854,880); and U.S. patent application Ser. No. 13/777,484, filed Feb. 26, 2013, entitled "Reduced Complexity Reliability Computations for Flash Memories," (now U.S. Pat. No. 9,053,804), incorporated by reference herein.

When a host requests a read operation, the controller 430 issues a hard-decision read and runs on-the-fly decoding on the input bits. During this procedure, the on-the-fly LLR LUT 830 obtained from cell-level statistics 825 is used in mapping input hard-decision bits (0/1) to LLRs. There may be multiple LUTs 830 since the controller 430 may use one LUT 830 for each granularity, e.g., each block. The multiple on-the-fly LLR LUTs 830 can be pre-loaded from the flash memory 170 and can then be accessed on-chip of the flash controller 425 without requiring extra reads during a host read operation, as shown in FIG. 8.

As the use condition changes, e.g., after a number of Program/Erase (P/E) cycling or retention, the noise on $V_t$ becomes more severe and on-the-fly ECC decoding may fail. With the soft-decision decoder 430 in place, it is beneficial to make soft reads on the failed codeword (or page) to obtain soft bit inputs. This is referred to as a soft read retry. The soft read retry can be initiated by the controller 425 by issuing multiple hard decision reads with different $V_{refs}$, or by a built-in command within the flash device 170. The outcome of retry read is a digitized representation of the analog value of $V_t$, referred to as a soft bit.

With the cell-level statistics available, the controller 425 can utilize the cell-level statistics in computing an LLR LUT for retry read, which maps soft bits into appropriate LLR inputs to the decoder 430. It has been shown that LLR computation based on cell-level statistics leads to better error correction performance. See, U.S. patent application Ser. No. 13/063,888, filed Aug. 31, 2011, entitled "Methods and Apparatus for Soft Data Generation in Flash Memories," now U.S. Pat. No. 8,830,748. Therefore, it is beneficial to utilize cell-level statistics also in retry read. Cell-level statistics 825 can also be organized with certain storage granularity of channel statistics and pre-loaded on-chip into cell-level statistics memory 830, such that it is readily available during retry, as shown in FIG. 8.

Pattern Dependent Cell-Level Statistics

As discussed above in conjunction with FIG. 3, the capacitance coupling between adjacent cells caused by inter-cell interference can disturb the $V_t$ of a victim cell by programming an adjacent aggressor cell. There may be multiple aggressor cells per victim cell. The cell-level statistics collection techniques described herein can be extended to collect aggressor-pattern-based statistics based on all pages within a word line, as well as pages within one or more neighboring word lines that contain one or more aggressor cells per victim cell.

FIG. 10 illustrates an exemplary aggressor-pattern cell-level statistics table 1000 where the statistics are normalized by the total number of cells. The exemplary aggressor-pattern cell-level statistics table 1000 records collected inter-wordline statistics indicating a transition probability for a given pair of bits $a_i b_i$ that represent a victim cell in a wordline. $a_i$ and $b_i$ refer to the upper (or MSB) page and lower (or LSB) bit of cell i. The size of the aggressor-pattern cell-level statistics table 1000 grows exponentially in the number of pages in a wordline, or in one embodiment it grows exponentially in the total number of pages in all aggressor wordlines (that are considered) and the current wordline.

In the exemplary table 1000 of FIG. 10, only one aggressor is accounted for in an MLC device, for ease of illustration. The exemplary table 1000 can be extended to aggressor patterns with multiple aggressor cells, as would be apparent to a person of ordinary skill in the art, based on the present disclosure.

The pattern-dependent cell-level statistics in the table 1000 can be collected and used in similar manner as the cell-level statistics discussed above. Generally, the controller 425 knows the relative position of aggressor cells with respect to the victim cell in a flash memory 170. Since this relationship is fixed for a given flash memory device 170 and programming sequence, it can therefore be pre-characterized and stored in table 1000.

Figure 11:
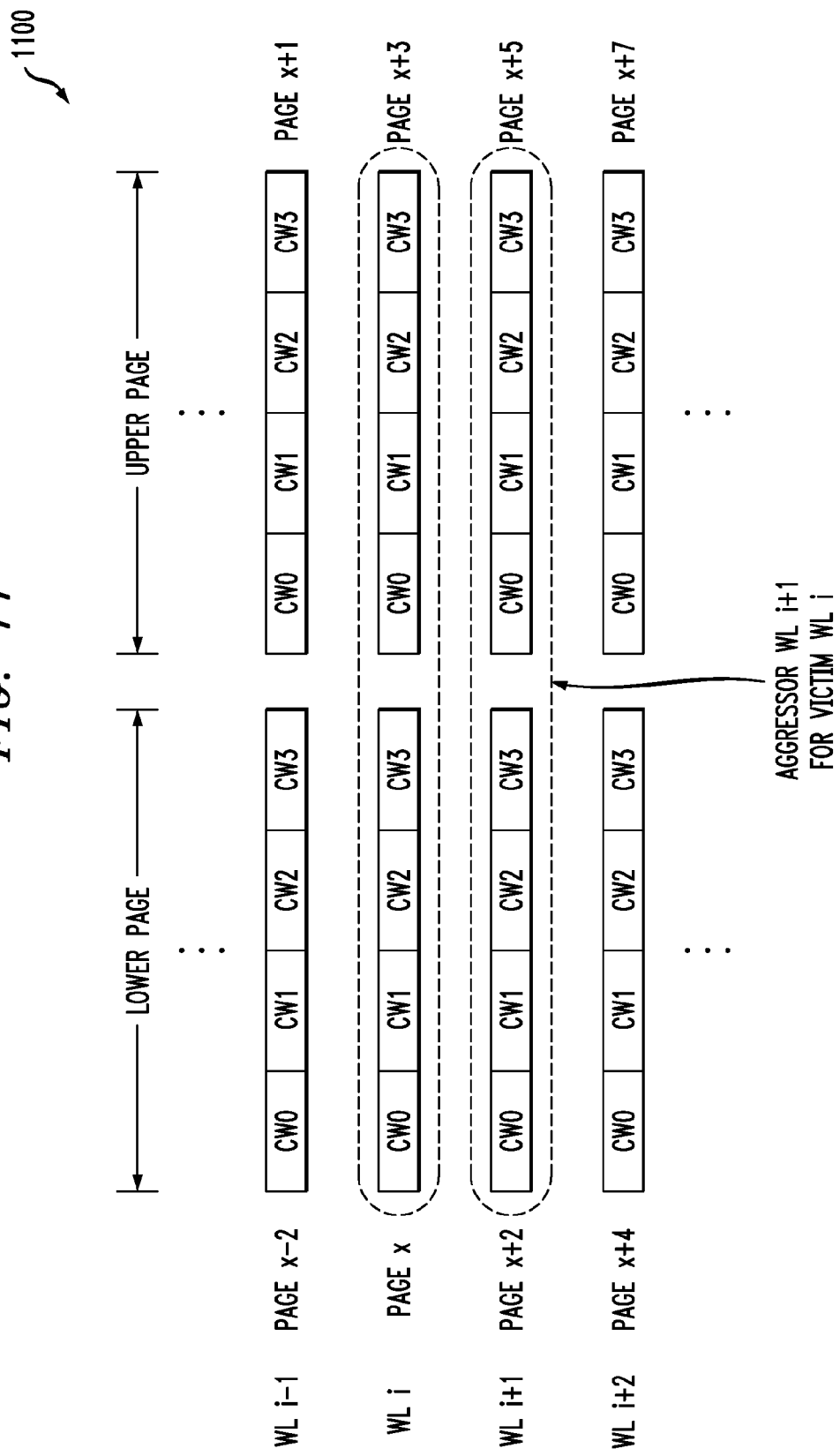
FIG. 11 illustrates a relative position of an aggressor word line with respect to a victim word line.

FIG. 11 illustrates a relative position of an aggressor word line $WL_{i+1}$ (where aggressor cells reside) with respect to a victim word line $WL_i$. As shown in FIG. 11, the victim word line $WL_i$ comprises a lower page x and an upper page x+3 and the aggressor word line $WL_{i+1}$ comprises a lower page x+2 and an upper page x+5. Each page in the exemplary flash memory of FIG. 11 comprises four codewords CW0 through CW3.

Figure 12:
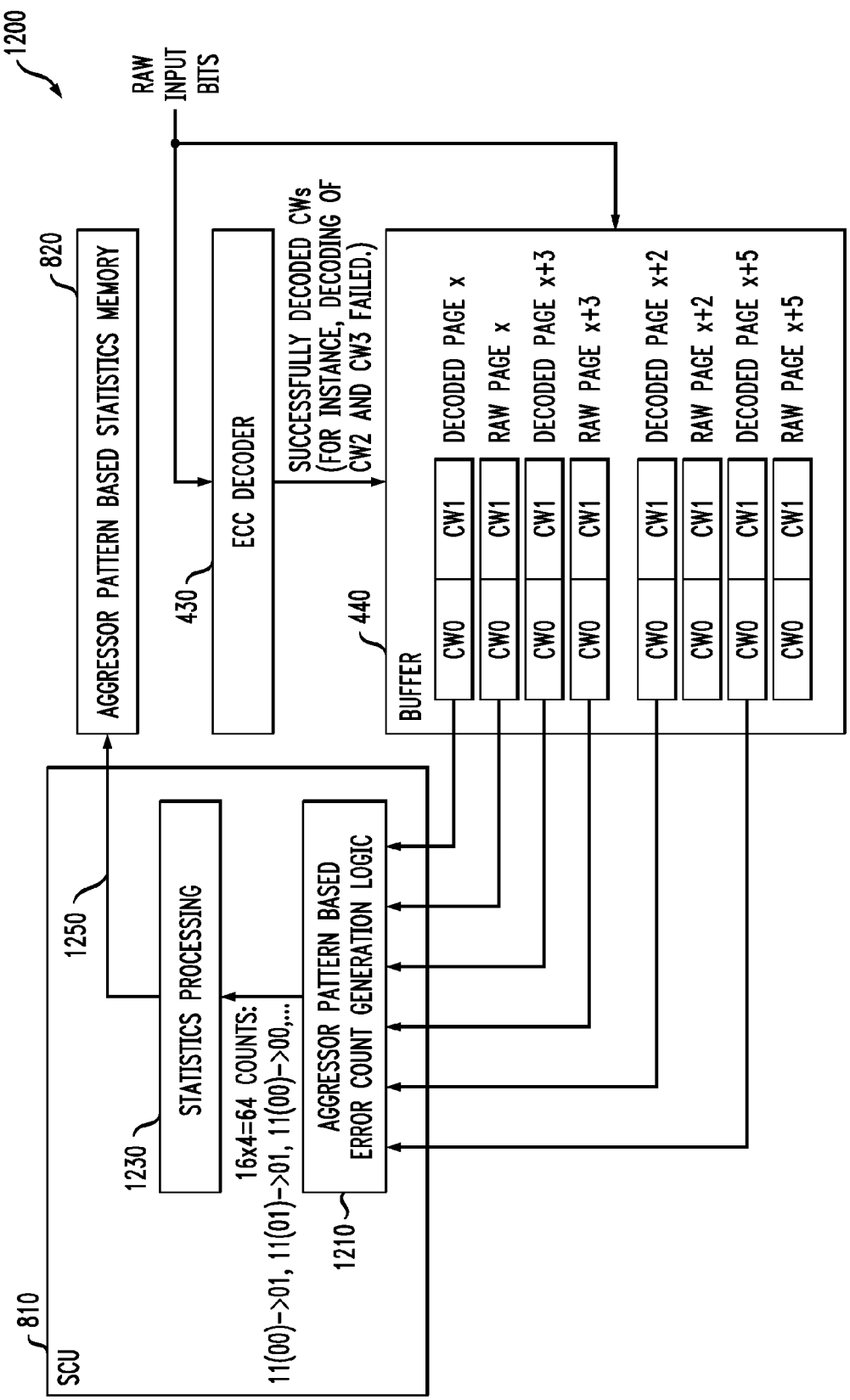
FIG. 12 illustrates an exemplary block diagram of a statistics collection system for the collection of aggressor-pattern cell-level statistics.

FIG. 12 illustrates an exemplary block diagram 1200 of the statistics collection unit 810 of FIG. 8 for the collection of aggressor-pattern cell-level statistics. The statistics collection unit 810 collects aggressor-pattern cell-level statistics 1250 from the following inputs: decoded lower victim page x, raw lower victim page x, decoded upper victim page x+3, raw upper victim page x+3, decoded lower aggressor page x+2, raw lower aggressor page x+2, decoded upper aggressor page x+5, and raw upper aggressor page x+5. A counter 1210 counts the number of errors from each state (written victim symbol)(aggressor pattern)) to another state (state transitions).

In one exemplary embodiment, the statistics storage granularity is one block. After statistics from one block are collected, the SCU 810 can then process them using block 1230 by processing the error counts to obtain the transition matrix 1000 that is stored in cell-level statistics memory 820. As shown in FIG. 12, the exemplary ECC decoder 430 operates on an ECC codeword level. If a page contains multiple codewords (four exemplary codewords per page are shown in FIG. 11, but only two are processed in FIG. 12 using a sampling approach) and all of them are decoded successfully and transferred to the buffer 440, the SCU 810 can then collect pattern-based statistics over both word lines. If a codeword was not decoded successfully, the decoder output is not reliable and cannot be used for cell-level statistics collection.

Assuming ICI cancellation is only used in retry because it requires reading of aggressor pages, the pattern-dependent cell-level statistics can be retrieved in retry and used to compute pattern-dependent LLRs, in order to improve ICI cancellation performance. See, for example, U.S. patent application Ser. No. 13/001,317, filed Dec. 23, 2010, entitled, "Methods And Apparatus For Soft Demapping And Intercell Interference Mitigation In Flash Memories," (now U.S. Pat. No. 8,788,923), and/or U.S. patent application Ser. No. 13/731,551, filed Dec. 31, 2012 (published as United States Patent Publication No. 2013/0185598), entitled "Multi-Tier Detection and Decoding in Flash Memories," each incorporated by reference herein.

In a further variation, the cell-level statistics tables 700, 1000 can be a function of one or more performance factors, such as endurance, number of program/erase cycles, number of read cycles, retention time, temperature, temperature changes, process corner, ICI impact, location within the memory array 170, location of wordline and/or page from which the read values are obtained, location of page within wordline from which the read values are obtained and a pattern of aggressor cells. One or more of the performance factors can be varied for one or more different bits within a cell, different pages within a wordline, different bit lines or different hard read data values. For a more detailed discussion of suitable techniques for computing a log likelihood ratio for memory devices based on such performance factor adjustments, see, for example, International Patent Application Serial No. PCT/US09/59069, filed Sep. 30, 2009 (published as PCT Patent Publication No. WO201039859 A1), entitled "Methods and Apparatus for Soft Data Generation for Memory Devices Based on Hard Data and Performance Factor Adjustment," incorporated by reference herein.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for processing data from a flash memory device, comprising the steps of:
    obtaining one or more read values for a plurality of bits in one or more pages of said flash memory device; and
    generating cell-level statistics for said flash memory device based on a probability that a data pattern was read from said plurality of bits given that a particular pattern was written to said plurality of bits.

2. The method of claim 1, wherein said generating step is performed substantially simultaneously with a reading of said one or more read values.

3. The method of claim 1, wherein said generating step is performed as part of a read scrub process.

4. The method of claim 1, further comprising the step of converting said one or more read values for said plurality of bits to a reliability value for a bit among said plurality of bits based on said cell-level statistics.

5. The method of claim 4, wherein said reliability value comprises one or more of a log-likelihood ratio and an approximation of a log-likelihood ratio.

6. The method of claim 4, wherein said reliability value maps a hard decision value to a soft input for processing by a soft decision decoder.

7. The method of claim 4, further comprising the step of storing said reliability value in a lookup table.

8. The method of claim 1, wherein said cell-level statistics are one or more of stored by a flash controller and stored in said flash memory device.

9. The method of claim 1, wherein said cell-level statistics are collected in a location-dependent manner.

10. The method of claim 1, wherein said cell-level statistics comprise pattern-dependent cell-level statistics for a victim cell and at least one aggressor cell of said flash memory device.

11. The method of claim 1, wherein said cell-level statistics are based on a number of errors from each state to another state divided by a total count of each state.

12. The method of claim 1, further comprising the step of storing said probability that said data pattern was read from said plurality of bits given that said particular pattern was written to said plurality of bits in one or more tables.

13. The method of claim 1, wherein said probability that said data pattern was read from said plurality of bits given that said particular pattern was written to said plurality of bits is based on one or more decoded decisions.

14. The method of claim 1, wherein said probability that said data pattern was read from said plurality of bits given that said particular pattern was written to said plurality of bits is based on one or more performance factors of said flash memory device.

15. A tangible machine-readable recordable storage medium for processing data from a flash memory device, wherein one or more software programs when executed by one or more processing devices implement the steps of the method of claim 1.

16. A flash memory device, comprising:
    a statistics collection unit configured to:
    obtain one or more read values for a plurality of bits in one or more pages of said flash memory device; and
    generate cell-level statistics for said flash memory device based on a probability that a data pattern was read from said plurality of bits given that a particular pattern was written to said plurality of bits.

17. The flash memory device of claim 16, wherein said cell-level statistics are generated substantially simultaneously with a reading of said one or more read values.

18. The flash memory device of claim 16, wherein said cell-level statistics are generated as part of a read scrub process.

19. The flash memory device of claim 16, further comprising a reliability value generation unit to convert said one or more read values for said plurality of bits to a reliability value for a bit among said plurality of bits based on said cell-level statistics.

20. The flash memory device of claim 16, wherein said cell-level statistics comprise pattern-dependent cell-level statistics for a victim cell and at least one aggressor cell of said flash memory device.

* * * * *

UNITED STATES PATENT AND TRADEMARK OFFICE
CERTIFICATE OF CORRECTION

PATENT NO. : 9,502,117 B2
APPLICATION NO. : 13/778728
DATED : November 22, 2016
INVENTOR(S) : Chen et al.

Page 1 of 1

It is certified that error appears in the above-identified patent and that said Letters Patent is hereby corrected as shown below:

In the Specification

In Column 6, Line 6, replace "relative to anew" with --relative to a new--.

In Column 10, Line 49, replace "decoded bits 850" with --output bits 850--.

In Column 10, Line 52, replace "enough (as as many as possible)" with --enough (as many as possible)--.

In Column 13, Line 31, replace "(written victim symbol)(aggressor pattern))" with --(written victim symbol)(aggressor pattern)--.

Signed and Sealed this
Seventeenth Day of January, 2017

Michelle K. Lee
*Director of the United States Patent and Trademark Office*